(12) United States Patent
Yong et al.

(10) Patent No.: US 10,598,490 B2
(45) Date of Patent: Mar. 24, 2020

(54) LASER LEVEL

(71) Applicant: STANLEY BLACK & DECKER INC., New Britain, CT (US)

(72) Inventors: Jiang Jia Yong, Suzhou (CN); Yu Feng Wu, Suzhou (CN)

(73) Assignee: Stanley Black & Decker Inc., New Britain, CT (US)

( * ) Notice: Subject to any disclaimer, the term of this patent is extended or adjusted under 35 U.S.C. 154(b) by 200 days.

(21) Appl. No.: 15/605,228

(22) Filed: May 25, 2017

(65) Prior Publication Data

US 2018/0321035 A1 Nov. 8, 2018

Related U.S. Application Data

(60) Provisional application No. 62/500,524, filed on May 3, 2017.

(51) Int. Cl.
*G01C 15/00* (2006.01)
*G02B 27/10* (2006.01)
(Continued)

(52) U.S. Cl.
CPC ........... *G01C 15/004* (2013.01); *G02B 5/001* (2013.01); *G02B 27/106* (2013.01);
(Continued)

(58) Field of Classification Search
CPC .... G01C 15/002; G01C 15/004; G01C 15/06; G01C 15/105; G01C 1/00; G01C 1/02
(Continued)

(56) References Cited

U.S. PATENT DOCUMENTS 3,820,903 A   6/1974 Kindl et al.
3,822,943 A   7/1974 Mason
(Continued)

FOREIGN PATENT DOCUMENTS

CA        2315592       2/2001
CN     201731878 U     2/2011
(Continued)

OTHER PUBLICATIONS

EP search report dated Oct. 11, 2018, for EP Application No. 18170125.1.
(Continued)

*Primary Examiner* — Yaritza Guadalupe-McCall
(74) *Attorney, Agent, or Firm* — Stephen R. Valancius

(57) ABSTRACT

A laser generating device including a housing and a laser module assembly. The laser module assembly is at least partially housed in the housing. The laser module includes a laser module. The laser module includes a laser generator, a transparent member and a cone member. The laser generator generates a laser beam which is directed towards a cone member. The cone member reflects the laser beam into a laser line. The transparent member has a generally cylindrical shape. The cone member includes a cone section including a reflecting surface and the cone section is located inside the transparent member. The cone member further includes a connection portion, the connection portion including a flange. The flange is located outside the transparent member at an outer surface of the transparent member.

20 Claims, 11 Drawing Sheets

(51) Int. Cl.
*H01S 5/00* (2006.01)
*G02B 5/00* (2006.01)
*G02B 27/14* (2006.01)
*H01S 5/02* (2006.01)
*H01S 5/022* (2006.01)

(52) U.S. Cl.
CPC ............ *G02B 27/108* (2013.01); *G02B 27/14* (2013.01); *H01S 5/005* (2013.01); *H01S 5/0071* (2013.01); *H01S 5/02* (2013.01); *H01S 5/02212* (2013.01)

(58) Field of Classification Search
USPC .................................................. 33/290, 286
See application file for complete search history.

(56) References Cited

U.S. PATENT DOCUMENTS

| | | | |
|---|---|---|---|
| 3,982,839 | A | 9/1976 | Schwartz |
| 4,111,564 | A | 9/1978 | Trice, Jr. |
| 4,679,937 | A | 7/1987 | Cain et al. |
| 4,767,208 | A * | 8/1988 | Cain .................. G01C 5/02 356/138 |
| 5,048,953 | A | 9/1991 | Kuo et al. |
| 5,257,279 | A | 10/1993 | Dugan et al. |
| 5,335,244 | A | 8/1994 | Dugan et al. |
| 5,459,932 | A | 10/1995 | Rando et al. |
| 5,590,712 | A | 1/1997 | Fisher et al. |
| 5,619,802 | A | 4/1997 | Rando et al. |
| 5,764,828 | A | 6/1998 | Iga et al. |
| 5,790,248 | A | 8/1998 | Ammann |
| 5,864,956 | A | 2/1999 | Dong |
| 6,282,028 | B1 | 8/2001 | Waibel et al. |
| 6,618,950 | B2 * | 9/2003 | Huang ................ G01C 15/004 33/285 |
| 6,751,879 | B1 | 6/2004 | Pu |
| 6,754,012 | B2 * | 6/2004 | Terauchi ............. G01C 15/006 359/709 |
| 6,892,463 | B1 | 5/2005 | Pu |
| 7,304,779 | B2 | 12/2007 | Guldevall |
| 7,328,516 | B2 | 2/2008 | Nash et al. |
| 7,497,018 | B2 | 3/2009 | Hersey et al. |
| 8,035,823 | B2 | 10/2011 | Keightley et al. |
| 8,307,562 | B2 | 11/2012 | Bascom et al. |
| 8,562,145 | B2 * | 10/2013 | Roberts .................. G09F 19/18 353/77 |
| 8,640,350 | B2 | 2/2014 | Bascom et al. |
| 8,813,379 | B2 * | 8/2014 | Zimmermann ........ G01B 11/26 33/281 |
| 8,950,879 | B2 * | 2/2015 | Sun ..................... G01C 15/004 33/276 |
| 9,065,241 | B2 * | 6/2015 | Zapata ..................... H01S 3/06 |
| 9,441,963 | B2 | 9/2016 | Bosch |
| 9,568,311 | B2 | 2/2017 | Dang et al. |
| 9,891,051 | B2 | 2/2018 | Zimmermann |
| 2002/0144415 | A1 | 10/2002 | Dang et al. |
| 2003/0067690 | A1 | 4/2003 | Terauchi et al. |
| 2003/0136901 | A1 | 7/2003 | Ohtomo et al. |
| 2004/0177523 | A1 | 9/2004 | Chang |
| 2005/0091859 | A1 | 5/2005 | Pu |
| 2005/0278963 | A1 | 12/2005 | Treichler et al. |
| 2008/0259346 | A1 | 10/2008 | Strahle |
| 2011/0280017 | A1 | 11/2011 | Dang |
| 2012/0182621 | A1 | 7/2012 | Zimmermann |
| 2012/0188645 | A1 | 7/2012 | Dang et al. |
| 2012/0327662 | A1 * | 12/2012 | Dang .................. G01C 15/004 362/259 |
| 2013/0160310 | A1 | 6/2013 | Dang |
| 2013/0194793 | A1 | 8/2013 | Bertsch |
| 2013/0301117 | A1 * | 11/2013 | Zapata ..................... H01S 3/06 359/342 |
| 2013/0301271 | A1 * | 11/2013 | Bittner ................ G01C 15/004 362/275 |
| 2015/0007437 | A1 | 1/2015 | Zimmermann |
| 2016/0293909 | A1 * | 10/2016 | O'Sullivan ......... H01M 2/1022 |
| 2018/0321035 | A1 * | 11/2018 | Yong ....................... H01S 5/005 |

FOREIGN PATENT DOCUMENTS

| | | | |
|---|---|---|---|
| CN | 201772365 U | 3/2011 | |
| CN | 201897477 U | 7/2011 | |
| CN | 202485678 U | 10/2012 | |
| DE | 102008041782 A1 | 3/2010 | |
| EP | 1296163 | 3/2003 | |
| EP | 2411761 | 2/2012 | |
| EP | 2411764 B1 | 4/2016 | |
| EP | 3037857 A1 * | 6/2016 | ......... G02B 19/0071 |
| JP | 5272972 A2 | 10/1993 | |
| JP | 2000-18946 | 1/2000 | |
| JP | 2002-195831 | 7/2002 | |
| TW | M302184 Y | 12/2006 | |
| WO | 95/06231 A1 | 3/1995 | |
| WO | WO2007140323 | 12/2007 | |
| WO | 10/026061 A2 | 3/2010 | |
| WO | WO2010108721 | 9/2010 | |
| WO | 12/075693 A1 | 6/2012 | |

OTHER PUBLICATIONS

Picture of laser module with an aluminium conical reflector glued to a glass cylinder, believed to be publically available for sale at least as early as 2015.
"Dewalt DW089K 3 Beam Line Laser website and manual, laser and manual believed to be prior art. Website accessed May 10, 2019."
"Stanley STHT1-77137 360 Line Laser website, laser believed to be prior art. Website accessed May 10, 2019."
"Spectra Lasers It56 Universal Laser Layout tool website, tool sheet and user guide, laser and related materials believed to be prior art. Website https://www.spectralasers.com/en/lt56-universal-laser-layout-tool.html#. XNWetoWcE2y accessed May 10, 2019."
"Bosch GLL3-80 360° Three-Plane Leveling and Alignment-Line Laser website, manual and parts diagram, laser believed to be prior art. Manual and parts diagram believed to be indicative of laser. Website https://www.boschtools.com/us/en/boschtools-ocs/line-lasers-gll-3-80-123072-p/ accessed May 10, 2019."
Coefficients of Linear Thermal Expansion; Linear temperature expansion coefficients for aluminum, copper, glass, iron and other common materials https://www.engineeringtoolbox.com/linear-expansion-coefficients-d_95.html.
List of Thermal Expansion Coefficients (CTE) for Natural and Engineered Materials: https://www.msesupplies.com/pages/list-of-thermal-expansion-coefficients-cte-for-natural-and-engineered-materials.

* cited by examiner

LASER LEVEL

CROSS-REFERENCE TO RELATED APPLICATION

This application claims the benefit of U.S. Provisional Application No. 62/500,524 filed on May 3, 2017, entitled Laser Level. The entire contents of U.S. Provisional Application No. 62/500,524 are incorporated herein by reference.

FIELD OF THE INVENTION

The present invention relates to laser levels, particularly laser levels with an improved construction.

BACKGROUND

There are various existing laser levels. It is desired to provide a laser level with an improved construction.

SUMMARY

According to an aspect, there is an exemplary embodiment including a laser generating device, comprising a housing and a laser module assembly. The laser module assembly is at least partially housed in the housing. The laser module includes a laser module. The laser module includes a laser generator, a transparent member and a cone member. The laser generator generates a laser beam which is directed towards a cone member. The cone member reflects the laser beam into a laser line. The transparent member has a generally cylindrical shape. The cone member includes a cone section including a reflecting surface and the cone section is located inside the transparent member. The cone member further includes a connection portion, the connection portion including a flange. The flange is located outside the transparent member at an outer surface of the transparent member.

The connection portion may wrap around an end of the transparent member.

The laser generating device may further include an adhesive between the flange and the outer surface of the transparent member.

The transparent member may be made of glass.
The cone member may be made of metal.
The cone member may be made of aluminum.
The cone member may be made as one piece.
The cone section may be made of aluminum.

A coefficient of thermal expansion of the cone member may be at least twice as much as a thermal expansion coefficient of the transparent member.

A coefficient of thermal expansion of the cone section may be at least twice as much as a thermal expansion coefficient of the transparent member.

A coefficient of thermal expansion of the connection section may be at least twice as much as a thermal expansion coefficient of the transparent member.

According to another aspect, there is an exemplary embodiment of a laser generating device including a housing and a laser module assembly, the laser module assembly at least partially housed in the housing. The laser module includes a pendulum and a laser module on the pendulum. The laser module includes a laser generator, a transparent member and a cone member. The laser generator generating a laser beam which is directed towards the cone member. The cone member is one integral piece and comprises a connection section and a cone section. The cone section has a reflective surface and the reflective surface reflects the laser beam into a laser line which exits the housing and is configured to project on a surface. The transparent member has a generally cylindrical shape with an inner surface, and outer surface opposite the inner surface. The reflective surface is located inside the transparent member and reflects the laser beam from the inside of the transparent member out through the transparent member. The connection section connects the cone member to the transparent member and wherein the connection section wraps around an end of the transparent member and includes a flange which is disposed around a portion of the outer surface of the transparent.

The transparent member may include glass.
The cone member may include metal.

At least the flange of the cone member may undergo thermal expansion and contraction at a rate at least 50% greater than the rate of thermal expansion and contraction of the portion of the outer surface of the transparent member around which the flange is disposed.

At least the flange of the cone member may undergo thermal expansion and contraction at a rate at least 100% greater than the rate of thermal expansion and contraction of the portion of the outer surface of the transparent member around which the flange is disposed.

According to another aspect, there is an exemplary embodiment of a laser generating device including a housing and a laser module assembly. The laser module assembly is at least partially housed in the housing and includes a pendulum assembly configured to rotate under the effects of gravity and a laser module on the pendulum assembly. The laser module includes a laser generator, a transparent member and a cone member, the laser generator generating a laser beam which is directed towards the cone member. The cone member is one integral piece and comprises a connection section and a cone section. The cone section has a reflective surface. The reflective surface reflects the laser beam into a laser line which exits the housing and is configured to project on an external surface outside of the laser generating device. The transparent member has a generally cylindrical shape with an inner surface, and outer surface opposite the inner surface. The reflective surface is located inside the transparent member and reflects the laser beam from the inside of the transparent member out through the transparent member. The connection section connects the cone member to the transparent member and wherein the connection section wraps around an end of the transparent member and includes a flange which is disposed outside the transparent member adjacent the outer surface. There is an adhesive between the flange and the outer surface of the transparent member which adheres the cone member to the transparent member.

A coefficient of thermal expansion of the cone member may be at least twice as much as a thermal expansion coefficient of the transparent member.

A coefficient of thermal expansion of the cone section may be at least twice as much as a thermal expansion coefficient of the transparent member.

A coefficient of thermal expansion of the connection section may be at least twice as much as a thermal expansion coefficient of the transparent member.

According to another aspect, there is a method of making a laser module for a laser level, the method including forming an integral, one-piece cone member, the cone member including a connection section and a cone section, the cone section having a reflective surface and the connection section having a flange. Forming a transparent member, the transparent member having an inner surface and an outer surface. Applying adhesive to at least one of the transparent member and the cone member. Joining the cone member to the transparent member such that the connection section wraps around an end of the transparent member and the flange which is disposed outside the transparent member adjacent an outer surface of the transparent member.

The method may also include providing a laser generating source which generates a laser beam which is reflected off of the cone member.

According to another aspect, there is method of manufacturing a laser level. The method includes forming a cone member, the cone member including a connection section and a cone section, the cone section having a reflective surface and the connection section having a flange. The method further includes connecting the cone member to a transparent member by joining the cone member to the transparent member at one end of the transparent member so that the connection section wraps around an end of the transparent member and the flange is disposed outside the transparent member adjacent an outer surface of the transparent member.

The cone member may be joined to the transparent member by an adhesive.

The adhesive may be deposited on one or both of the cone member and the transparent member before joining.

The adhesive may be deposited on the cone member at the flange.

The adhesive may be deposited on the transparent member on an outer surface of the transparent member.

When assembled, there is an adhesive between the flange and the outer surface of the transparent member which adheres the cone member to the transparent member.

The cone member and transparent member may be part of a laser module which includes a laser generating source.

The laser generating source may generate a laser beam which is directed towards the cone member and is reflected by the cone member.

The laser beam may be reflected by a conical section of the cone member.

The conical section may have a reflective surface which reflects the cone member.

The laser module may be disposed on a pendulum.

There may be more than one laser module on the pendulum, the laser modules and pendulum together forming a laser module assembly.

There may be three laser modules on the pendulum.

The laser module assembly may be housed in a housing.

The laser diode may be powered by a removable power tool battery pack.

DETAILED DESCRIPTION OF EXEMPLARY EMBODIMENTS

Figure 1:
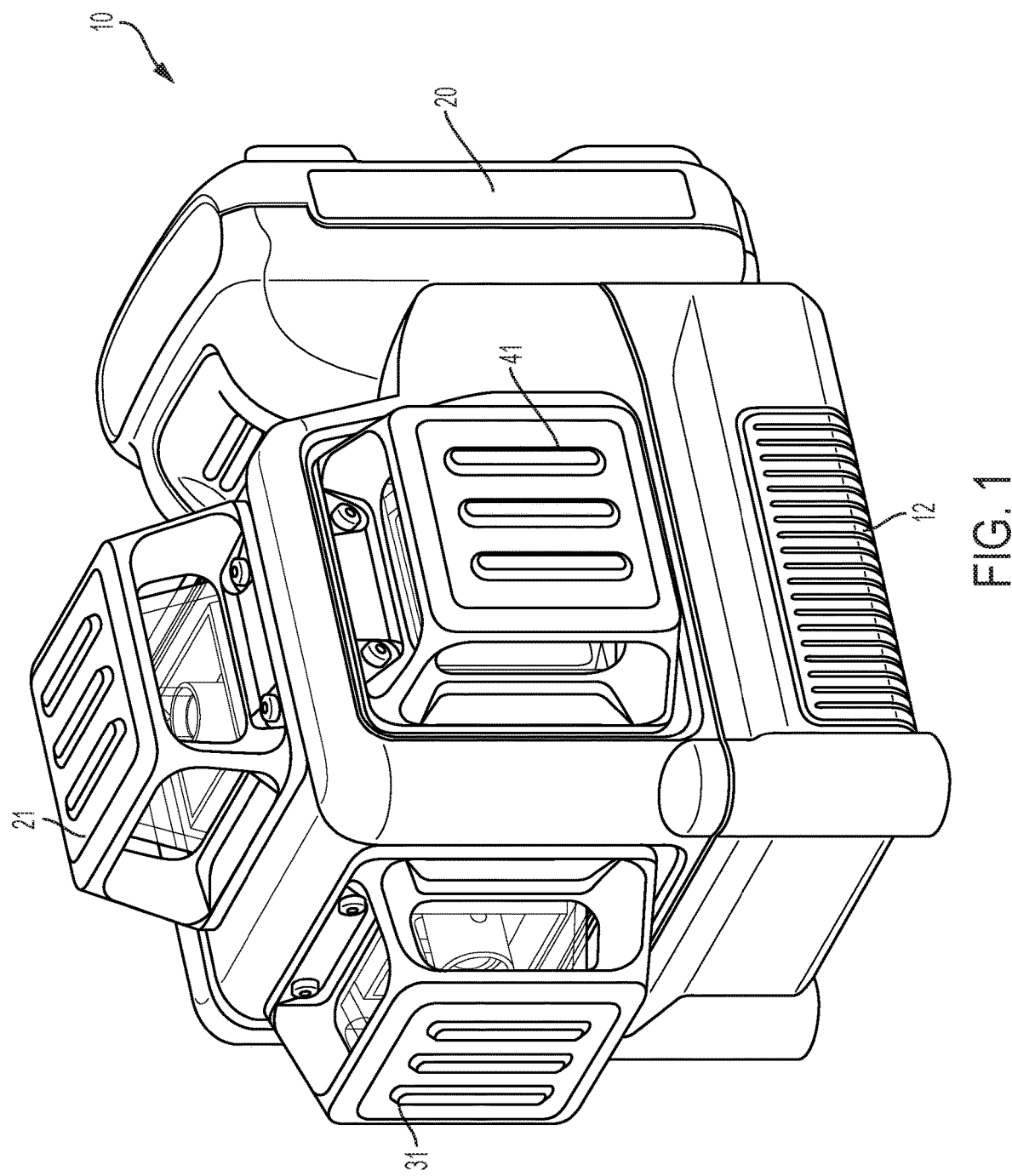
FIG. 1 illustrates a perspective view of an exemplary embodiment of a laser level.
Figure 2:
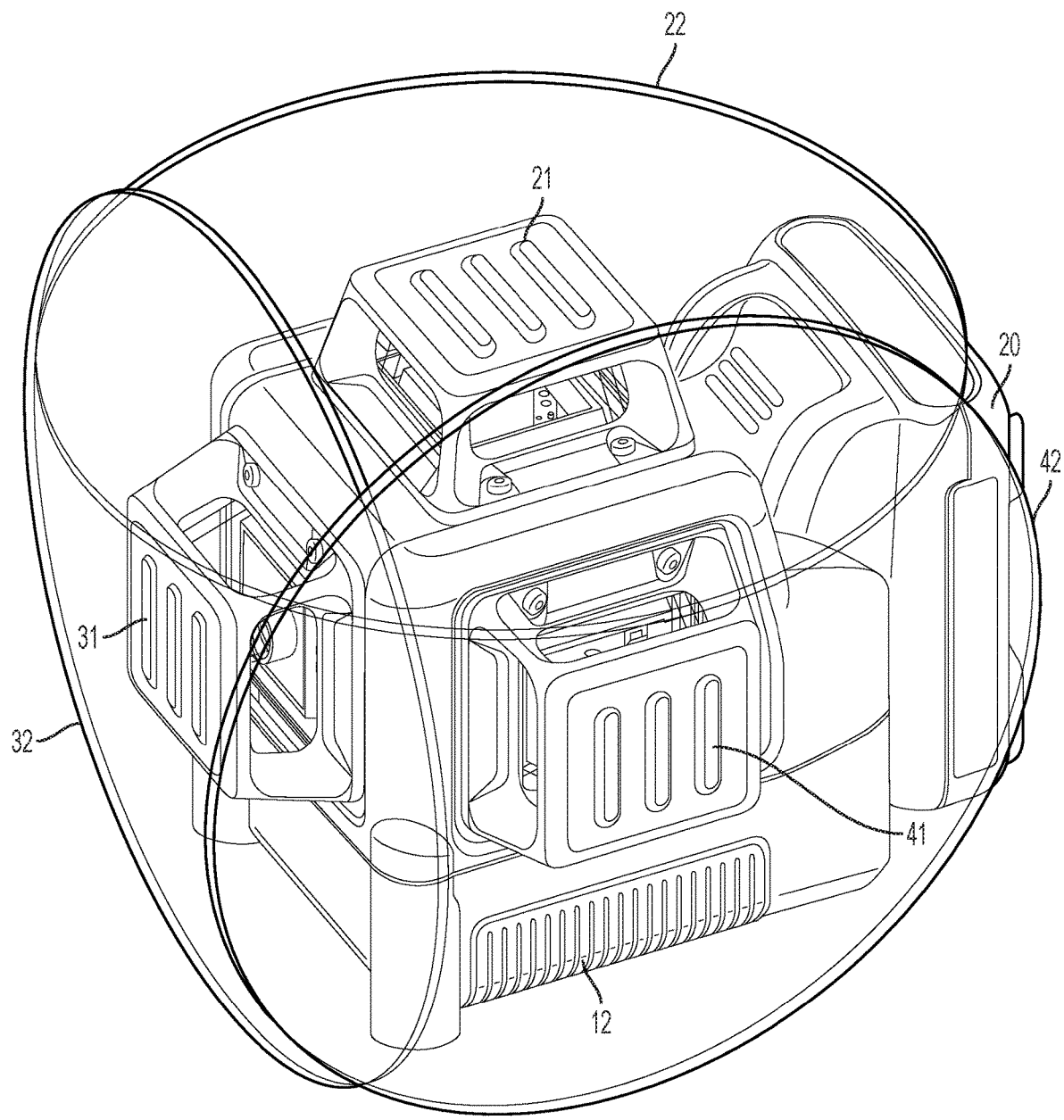
FIG. 2 is another perspective view of the exemplary embodiment of the laser level.
Figure 3:
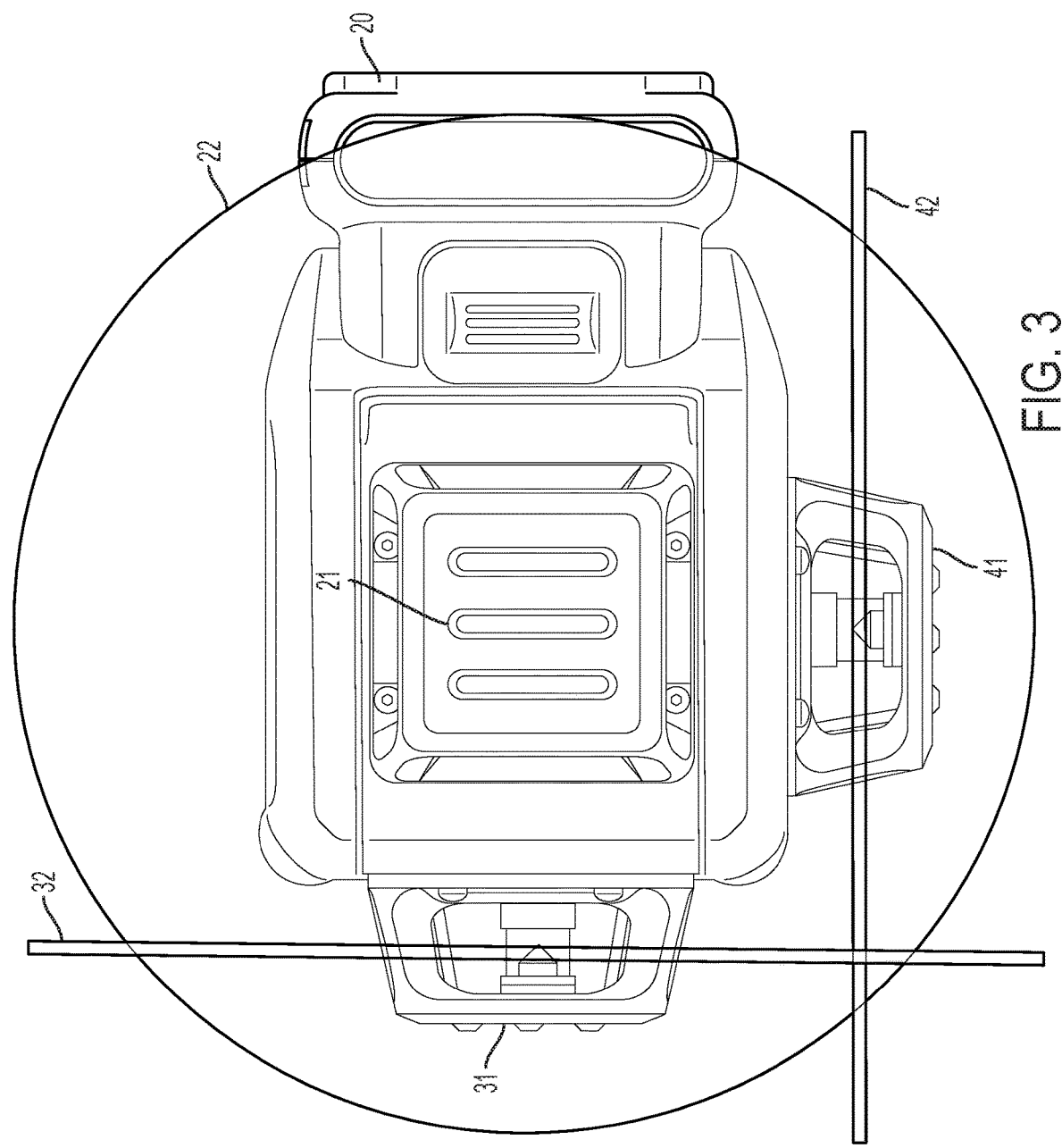
FIG. 3 is a top view of the exemplary embodiment of the laser level.

An exemplary embodiment according to the present application is shown in FIGS. 1-15. With reference to FIGS. 1-3, there is illustrated an exemplary embodiment of a laser level 10. FIG. 1 is a perspective view of the laser level. FIGS. 2 and 3 illustrate the laser level shown with laser lines 22, 32 and 42 projecting from the laser level 10. FIG. 2 is a perspective view of the laser level 10 and FIG. 3 is a top view of the laser level 10. The laser level 10 of the exemplary embodiment includes a housing 12. A battery pack 20 is removably attached to the housing 12 and powers the laser level 10. The battery pack 20 may be a power tool battery pack which can also be coupled with power tools such as drills, sanders, saws, etc., to provide power to those tools. The battery pack 20 houses a plurality of battery cells (not shown). The battery cells may be cylindrical lithium-ion battery cells or may have other battery chemistries or geometries.

With reference to FIGS. 1-3, the laser level includes three projector portions 21, 31 and 41. The projectors portions 21, 31, 41 are protected openings through which laser modules 50 extend so that the laser modules 50 can project laser lines 22, 32 and 42 outside of the housing 12 onto an external surface. Specifically, laser line 22 projects out of the housing 12 at projector 21. Laser line 22 is configured to define a horizontal plane when the laser level 10 is set on a horizontal surface. Laser line 32 projects out of the housing 10 at projector 31. Laser line 32 is configured to define a vertical plane when the laser level 10 is set on a horizontal surface. Laser line 42 projects out of the housing 10 at projector 41. Laser line 42 is configured to define another vertical plane when the laser level 10 is set on a horizontal surface. As shown in FIGS. 2 and 3, laser line 42 is perpendicular to laser lines 32 and 22.

Figure 4:
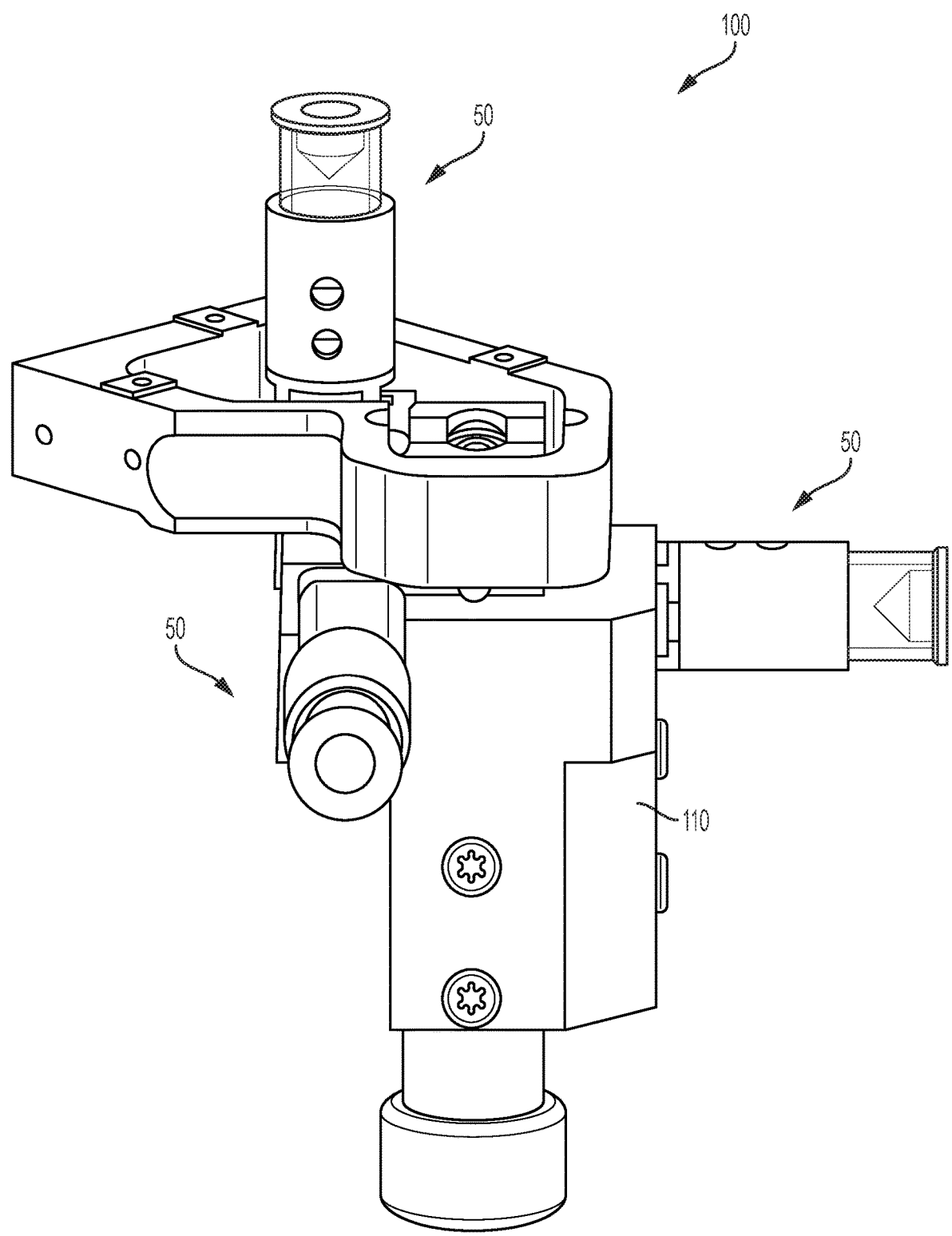
FIG. 4 is a side perspective view of an exemplary embodiment of the laser module assembly of the exemplary embodiment of the laser level.

FIG. 4 illustrates a laser module assembly 100. The laser module assembly 100 is housed in the housing 12 of the laser level 10. The laser module assembly 100 includes three laser modules 50. The three laser modules 50 are carried on a pendulum assembly 110. Pendulum assemblies are well known in the art. The pendulum assembly 110 rotates about a relatively small angle so that the laser modules 50 project beams in the horizontal and vertical planes, as previously discussed, when placed on a surface that is not entirely horizontally flat. For example, if the laser level 10 is placed on a surface that is sloped five degrees (5°) with respect to horizontal, the pendulum assembly 110 will tilt under the influence of gravity so that the laser modules 50 are aligned to produce a laser line 22 in a horizontal plane and laser lines 32 and 42 in vertical planes. Additionally, in some embodiments the laser level 10 includes a locking device to lock the pendulum assembly 110. In those instances the pendulum assembly 110 will be locked in a particular position rather than allowed to rotate under the influence of gravity and it may produce laser lines offset from the vertical and horizontal.

Figure 6:
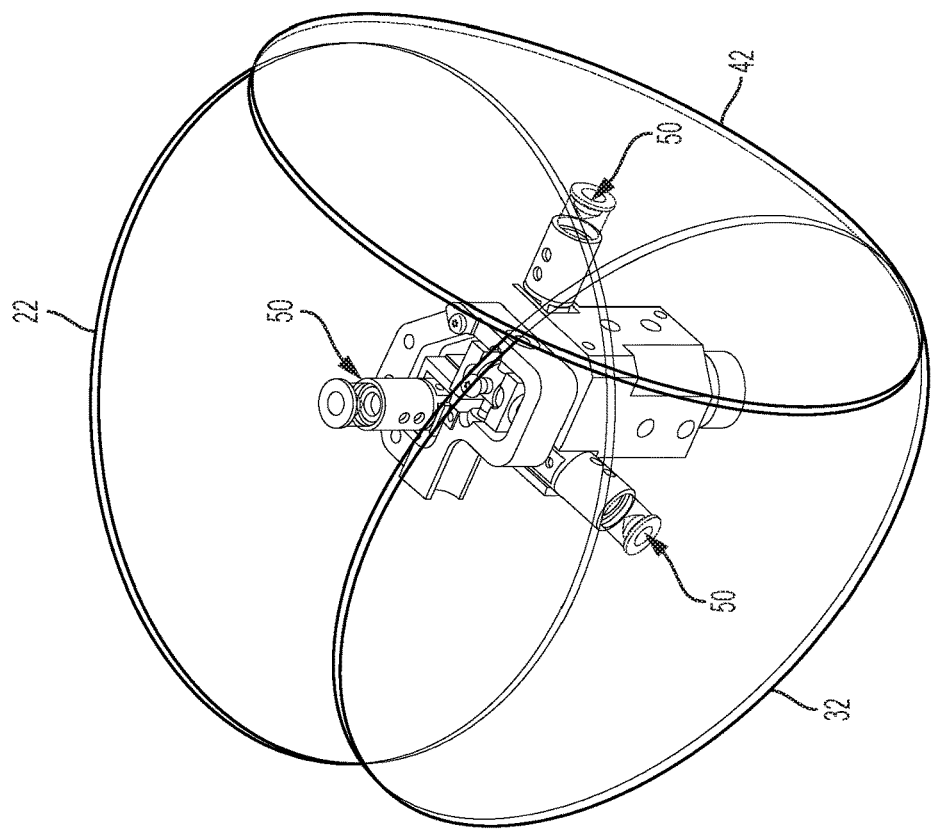
FIG. 6 is a side perspective view of an exemplary embodiment of the laser module assembly of the exemplary embodiment of the laser level.
Figure 5:
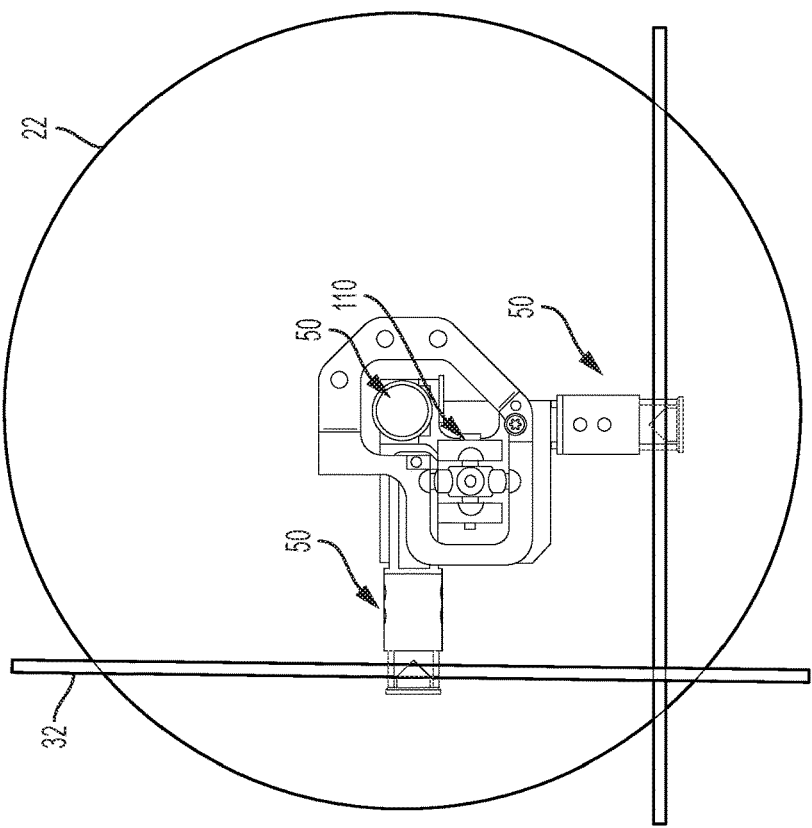
FIG. 5 is a side perspective view of an exemplary embodiment of the laser module assembly of the exemplary embodiment of the laser level.

FIGS. 5 and 6 illustrate the laser module assembly 100 projecting laser lines 22, 32 and 42. As will be appreciated, these laser lines 22, 32, 42 project out of the laser level 10 at the projector portions 21, 31 and 41.

Figure 9:
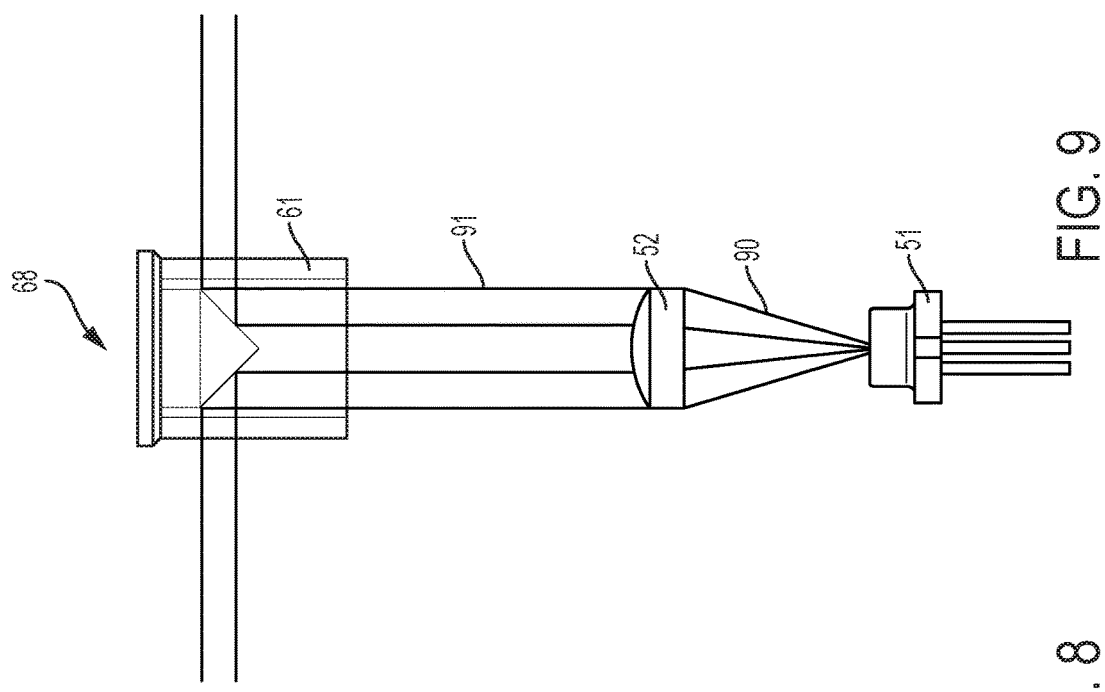
FIG. 9 is side view of selected components of the laser module of the exemplary embodiment.
Figure 8:
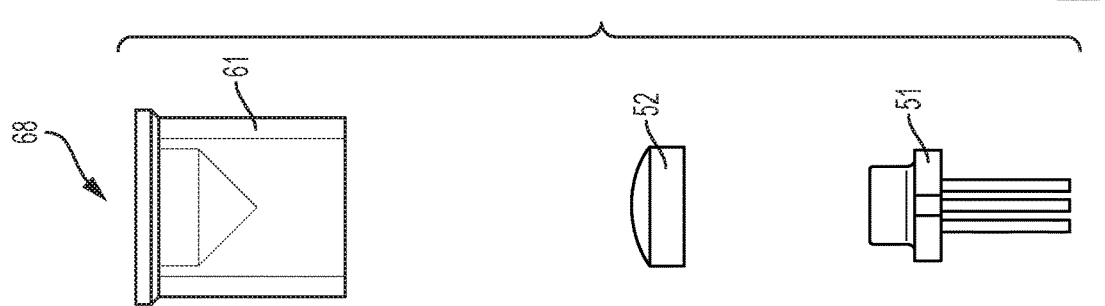
FIG. 8 is side view of selected components of the laser module of the exemplary embodiment.
Figure 7:
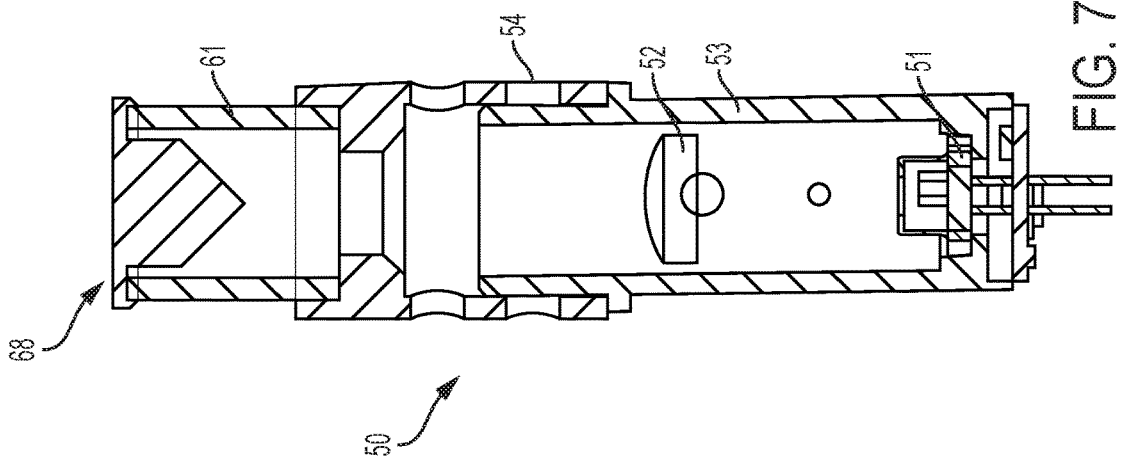
FIG. 7 is a side cross sectional view of a laser module according to an exemplary embodiment of the present application.
Figure 11:
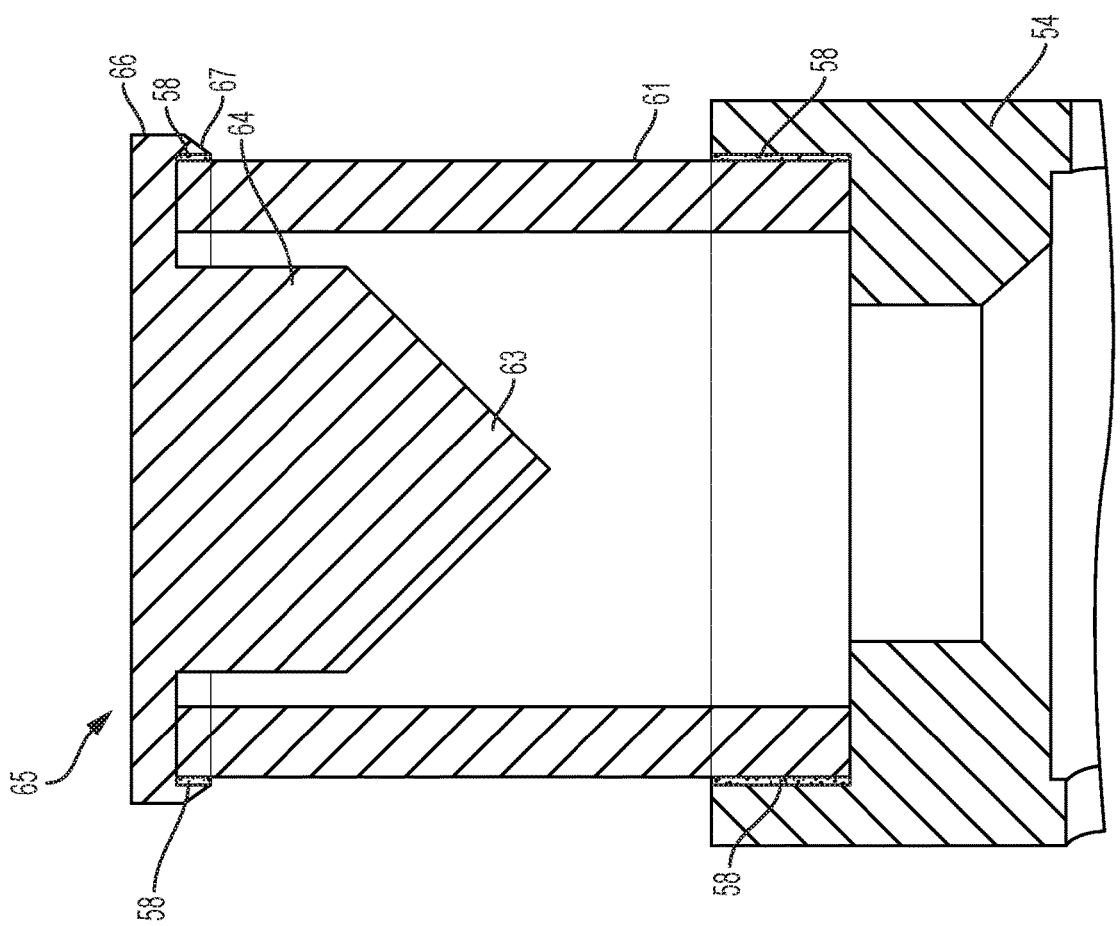
FIG. 11 is a side cross-sectional view of selected components of the laser module of the exemplary embodiment.
Figure 10:
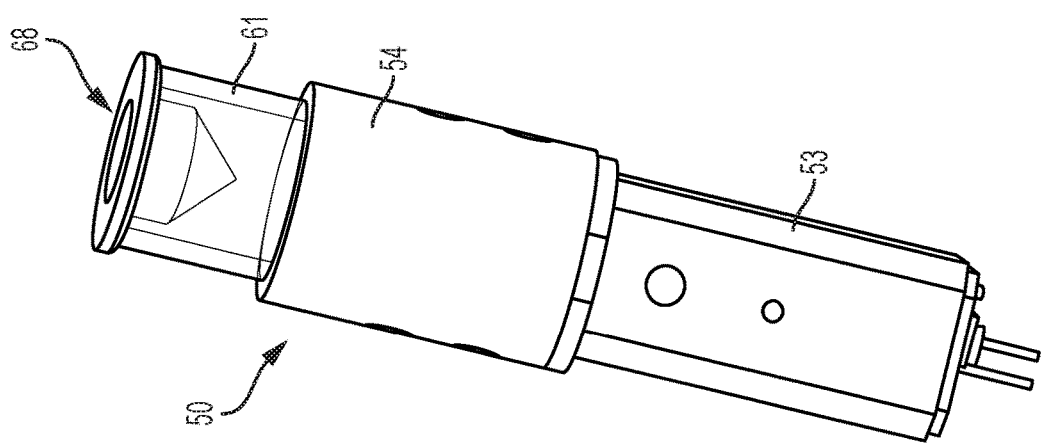
FIG. 10 is a side perspective view of the laser module of the exemplary embodiment.
Figure 12:
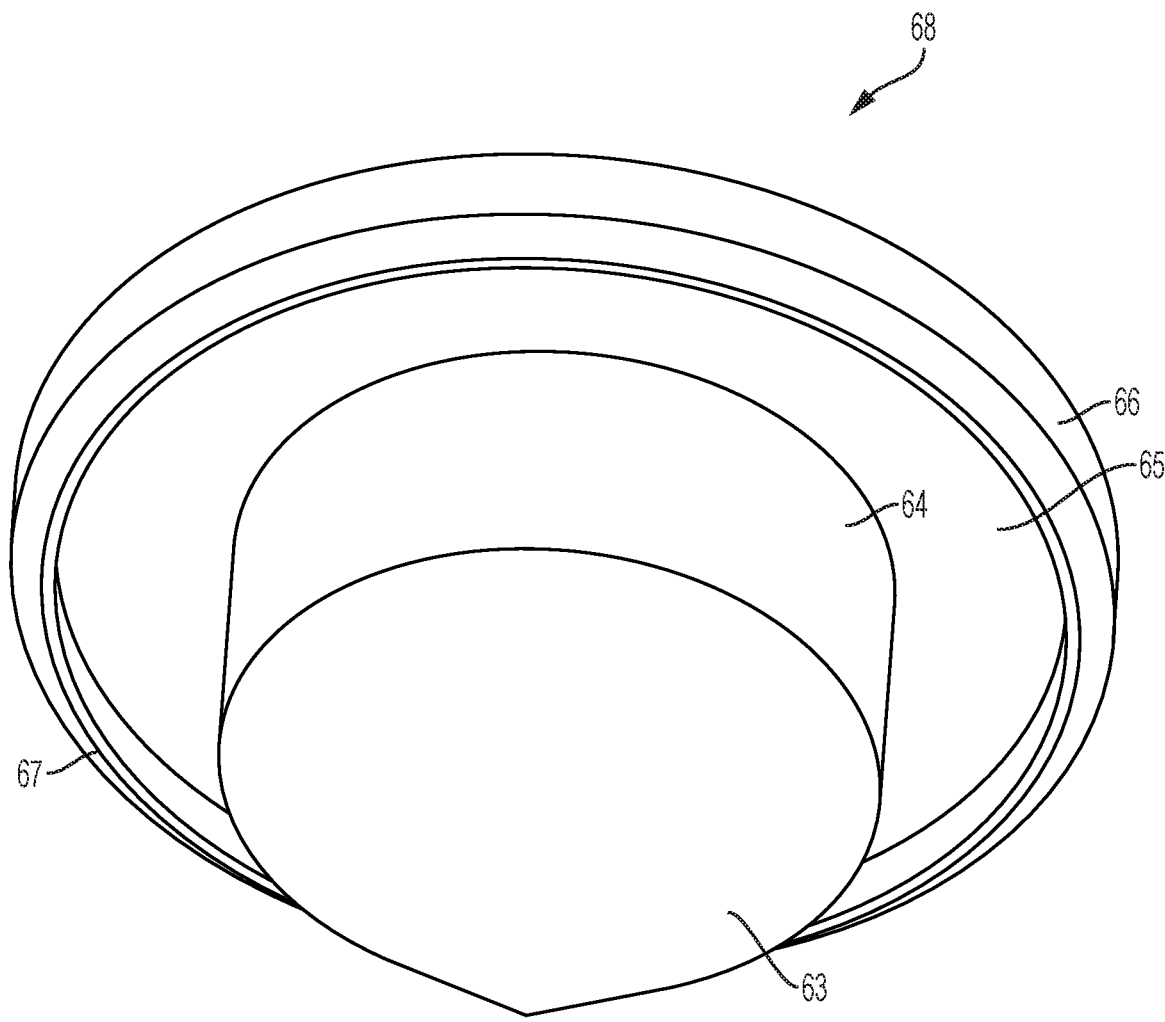
FIG. 12 is perspective view of the cone member of the exemplary embodiment.
Figure 13:
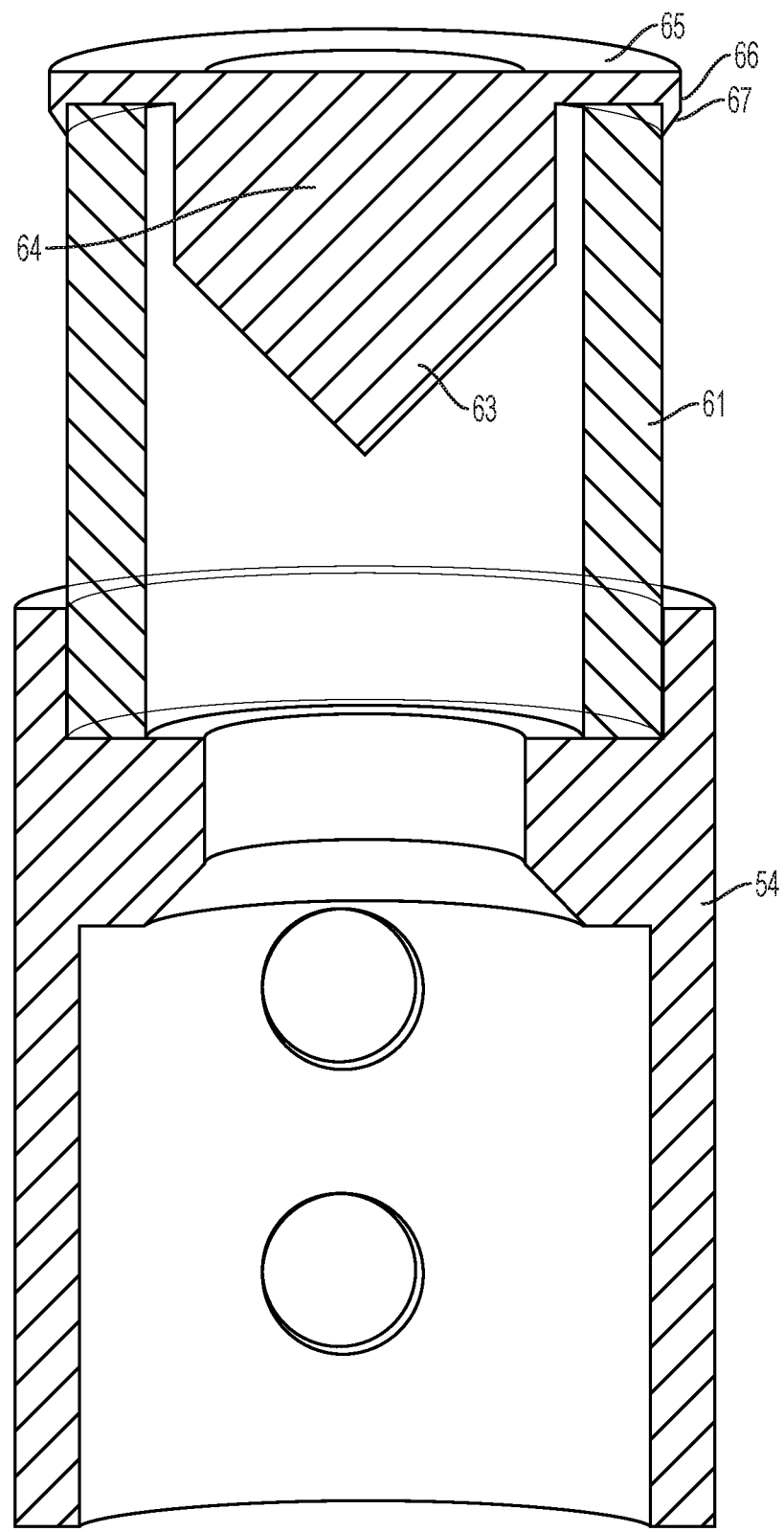
FIG. 13 is side cross-sectional view of selected components of the laser module assembly of the exemplary embodiment.
Figure 14:
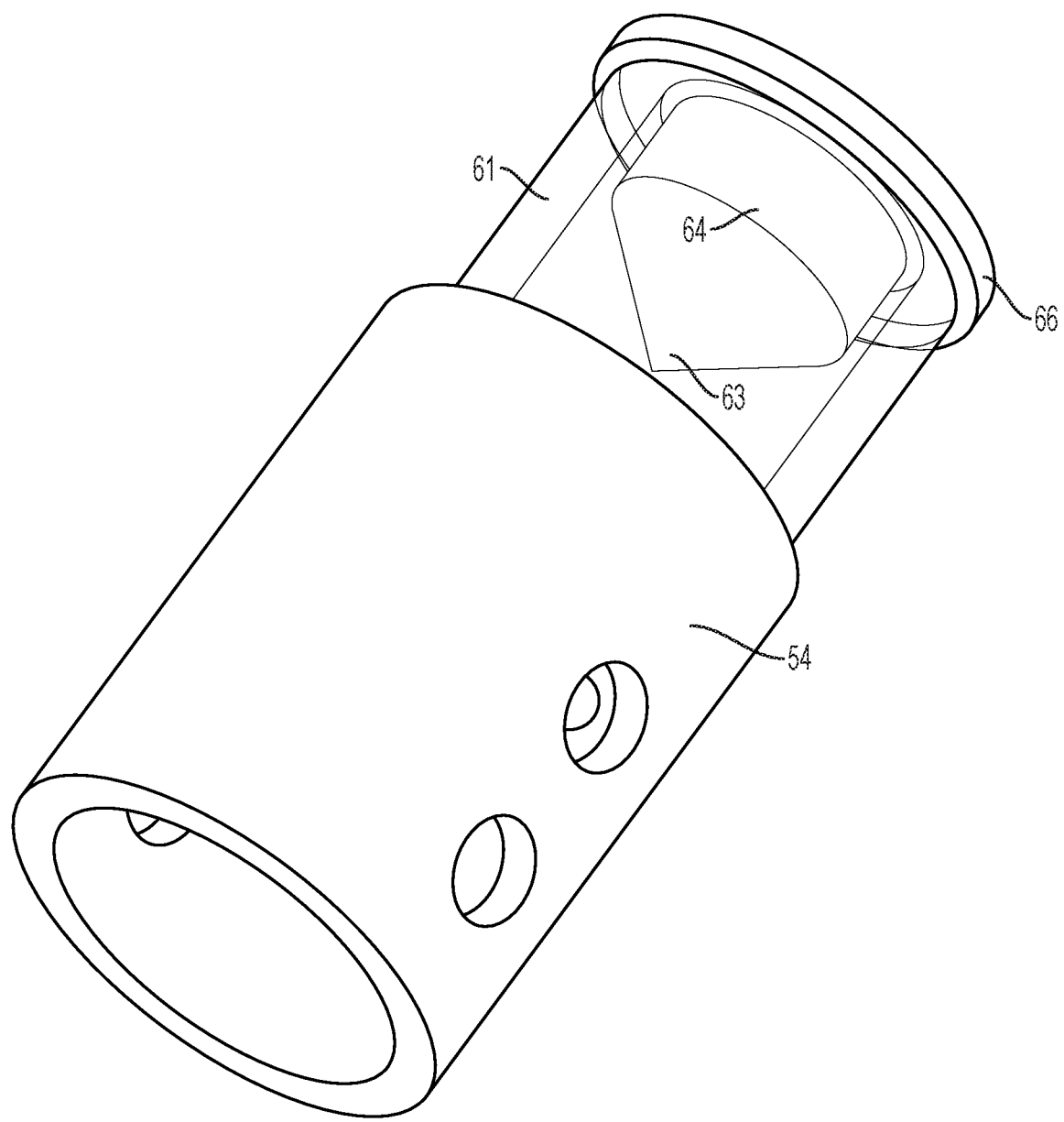
FIG. 14 is perspective view of selected components of the laser module assembly of the exemplary embodiment.
Figure 15:
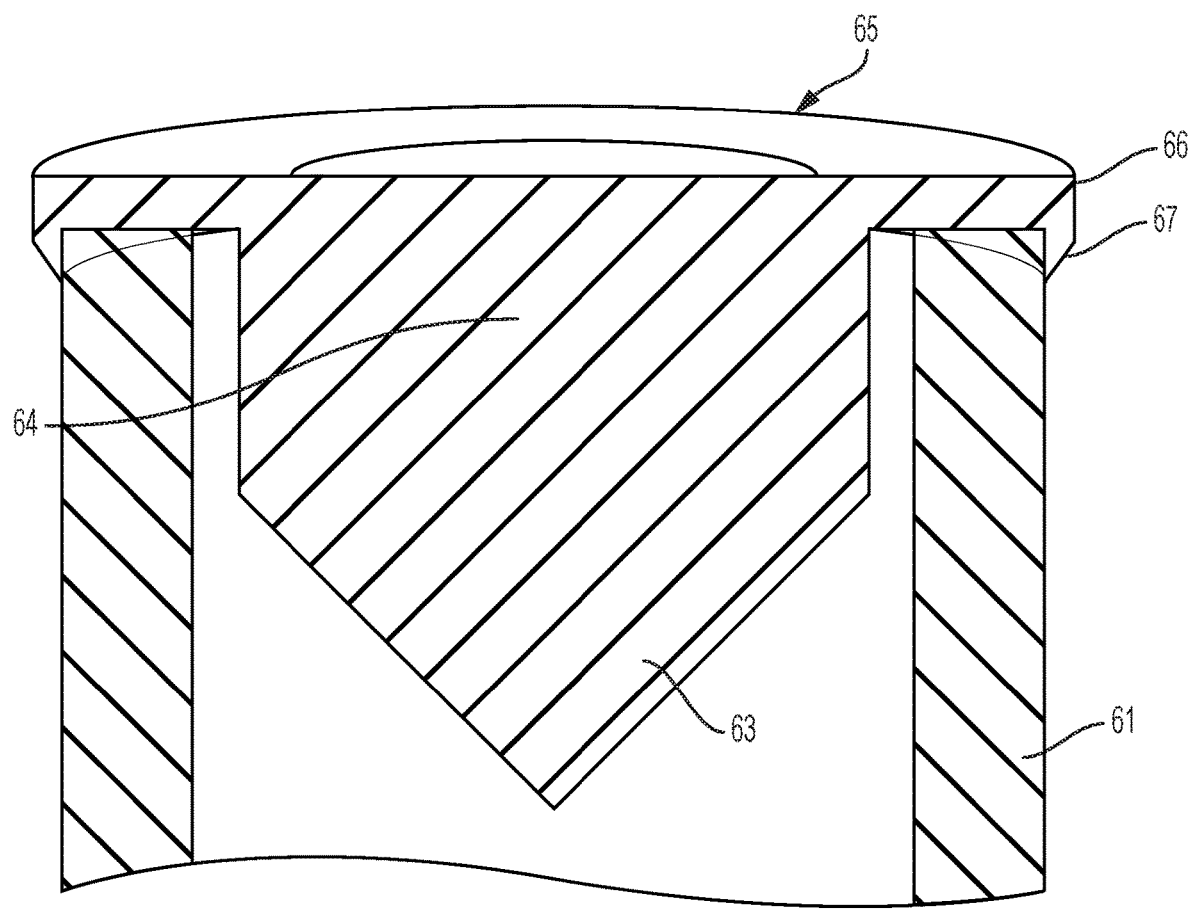
FIG. 15 is side cross-sectional view of selected components of the laser module assembly of the exemplary embodiment.

FIGS. 7-15 illustrate the laser modules 50 of the exemplary embodiment. FIG. 7 illustrates a cross-sectional view of a fully assembled laser module 50. A perspective view of an assembled laser module 50 is shown in FIG. 10. FIGS. 8 and 9 are side views of selected components of the laser module 50. FIGS. 11, 13 and 15 are side cross-sectional views of selected components of the laser module 50 and FIG. 14 is perspective view of selected components of the laser module 50. FIG. 12 is perspective view of the cone member 68.

The laser module 50 includes a laser diode 51. The laser diode 51 serves as a laser generating source. Other Laser generating members may be used as a laser generating source to generate a laser beam in other embodiments. The laser diode 51 is held in a first barrel 53. A collimating lens 52 is also held in the first barrel 53. The first barrel 53 is generally cylindrically shaped. A second barrel 54 is disposed at a top end of the first barrel 53. The second barrel 54 is also generally cylindrically shaped and fits over the outer surface of the first barrel 53. The second barrel 54 may be attached to the first barrel 53 in any of a number of manners. For example, they may, among other things, be frictionally fit together, adhered together by an adhesive, soldered together, kept together by fasteners or they may be attached by a combination of the preceding or other attachment methods.

The laser modules 50 also include a transparent member 61 which fits inside the second barrel 54 at a first end. The transparent member 61 is cylindrical. An outer surface of the transparent member 61 contacts an inner surface of the second barrel 54. The transparent member 61 may be attached to the second barrel 54 in any of a number of manners, including those listed above for attachment of the first and second barrels 53, 54. A cone member 68 is attached at a top of the transparent member 61. With reference to FIGS. 11 and 12, the cone member 68 includes a connection portion 65. The connection portion 65 has a top that is flat and has a circular shape. The connection portion 65 also includes a flange 66 at its outer edge. The flange 66 includes a chamfer 67. As shown in various Figs., such as FIGS. 11, 13 and 14, the flange 66 extends around an end of the transparent member 61.

A base portion 64 extends from the connection portion 65 towards the laser diode 51. The base portion 64 has a cylindrical shape. At an end of the base, is a cone section 63 which has the shape of a right angle cone. An outer surface of the cone section 63 reflects the laser from the laser diode 51. The cone member 68 may be entirely made of an aluminum material that is reflective. Alternatively or additionally, an outer surface of the cone section 63 may be coated with a reflective material. Operation of the cone member 68 will be explained with reference to FIG. 9. As shown in FIG. 9, the laser diode 51 produces a laser beam 90. The laser beam 90 passes through and is collimated by the collimating lens 52. The collimated beam 91 travels to the cone member 68 where it is reflected off of the outer surface of the cone section 63. The reflected beam forms one of the previously discussed laser lines 22, 32, 42.

In other embodiments, the collimated beam 91 may be offset from an apex of the cone section 63 to provide less than a 360 degree line/plane output or more or less power in a certain direction or directions. Other variations are also contemplated. For example, in some embodiments, the cone section could be less than a full cone, such as a half cone. A top or bottom of the cone shape could also be truncated. In other embodiments, rather than a cone section, there could be a section of a different shape to provide a different output or only the portion of the cone that is necessary for reflection may be used.

The cone member 68 of the exemplary embodiment is made of aluminum by a single pointer diamond turning process and may have a thermal expansion coefficient of around $20 \times 10^{-6}$/K. Accordingly, the cone member 68 of the exemplary embodiment is an integral, one-piece part, rather than, for example, the connection section 65 being a separate part connected to the base portion 64 by an adhesive.

In other embodiments, the cone member 68 may be multiple parts. For example, the connection section 65 may be a separate part connected to the base portion 64 by an adhesive or other means. Additionally, in such other embodiments, the materials of the different parts of the cone member 68 may be made of different materials. For example, the connection section 65 may be made of a first metal material and the cone section 63 may be made of a second metal material, different than the first metal material.

In the exemplary embodiment, the cone section 63 is made of aluminum and a surface of it is reflective. In other embodiments, a reflective coating could be used on the cone surface.

The transparent member of the exemplary embodiment is made of glass, such as quartz or borosilicate and may have a thermal expansion coefficient of around $0.6 \times 10^{-6}$/K or $3.3 \times 10^{-6}$/K, respectively. Accordingly, the thermal expansion coefficient of the cone member 68 is different, specifically larger in the exemplary embodiment, than that of the transparent member 61. In some embodiments, the thermal expansion coefficient of the cone member 68 may be 2, 3, 4 or 5 times as large as the thermal expansion coefficient of the transparent member 61.

As shown in FIG. 11, the cone member 68 is secured to the transparent member 61 by an adhesive 58. The adhesive is disposed between the flange 66 and an outer surface of the transparent member 61.

Arranging the flange 67 around the outside of the transparent member 61 is beneficial in accommodating thermal expansion and contraction between the cone member 68 and the transparent member 61. For example, the shape allows for even expansion and compression of the cone member 68 and helps to prevent non-linear expansion/compression. The adhesive also provides some additional buffering.

In assembly, the adhesive 58 may be put on the cone member 68 at the flange 66 and then the cone member 68 placed on the transparent member 61. Alternatively, the adhesive 58 may be put on the flange 66 and then the cone member 68 secured to the transparent member 61 or adhesive may be put on both the cone member 68 and the transparent member 61. The joined cone member 68 and transparent member 61 may be assembled with the other parts of the laser level 10 in various orders. For example, after the cone member 68 is adhered to the transparent member 61, the transparent member may be connected to the second barrel 54 and the remaining parts of the laser module 50. The laser module 50 may then be assembled with the pendulum 110 to form the laser module assembly 100. The laser module assembly 100 can then be assembled into the housing 12. The housing 12 may consist of two clamshell parts which are fixed together to house the laser module assembly. As noted, different orders of assembly of the parts are contemplated. For example, the transparent member 61 may be assembled with the second barrel member 54 before the transparent member 61 cone member 68 is assembled to the transparent member. Similarly, the second barrel member 54 may be attached to the first barrel member 53 before or after the second barrel member 54 is attached to the transparent member 61.

While the invention has been described by way of exemplary embodiments, it is understood that the words which have been used herein are words of description, rather than words of limitation. Changes may be made within the purview of the appended claims, without departing from the scope and spirit of the invention in its broader aspects.

What is claimed is:

1. A laser generating device, comprising:
    a housing;
    a laser module assembly, the laser module assembly at least partially housed in the housing, the laser module assembly including a laser module;
    wherein the laser module includes a laser generator, a transparent member and a cone member, the laser generator generating a laser beam which is directed towards the cone member and wherein the cone member reflects the laser beam into a laser line;
    wherein the transparent member has a generally cylindrical shape with an inner surface and an outer surface opposite the inner surface;
    wherein the cone member includes a cone section including a reflecting surface and the cone section is located inside the transparent member;
    wherein the reflecting surface reflects the laser beam from inside of the transparent member out through the transparent member;
    wherein the cone member further includes a connection portion, the connection portion including a flange, wherein the flange is located outside the transparent member at the outer surface of the transparent member;
    wherein the transparent member is generally hollow and wherein there is a space between the reflecting surface and the transparent member.

2. The laser generating device of claim 1, wherein the connection portion wraps around an end of the transparent member.

3. The laser generating device of claim 1, wherein the transparent member is made of glass.

4. The laser generating device of claim 1, wherein the cone member is made of metal.

5. The laser generating device of claim 1, wherein the cone member is made of aluminum.

6. The laser generating device of claim 1, wherein the cone member is made as one piece.

7. The laser generating device of claim 1, wherein the cone section is made of aluminum.

8. The laser generating device of claim 1, wherein a coefficient of thermal expansion of the cone member is at least twice as much as a thermal expansion coefficient of the transparent member.

9. The laser generating device of claim 1, wherein a coefficient of thermal expansion of the cone section is at least twice as much as a thermal expansion coefficient of the transparent member.

10. The laser generating device of claim 1, wherein a coefficient of thermal expansion of the connection section is at least twice as much as a thermal expansion coefficient of the transparent member.

11. The laser generating device of claim 1, further comprising an adhesive between the flange and the outer surface of the transparent member.

12. A laser generating device, comprising:
    a housing;
    a laser module assembly, the laser module assembly at least partially housed in the housing, the laser module assembly including a pendulum and a laser module on the pendulum;
    wherein the laser module includes a laser generator, a transparent member and a cone member, the laser generator generating a laser beam which is directed towards the cone member;
    wherein the cone member is one integral piece and comprises a connection section and a cone section, the cone section having a reflective surface, wherein the reflective surface reflects the laser beam into a laser line which exits the housing and is configured to project on a surface;
    wherein the transparent member has a generally cylindrical shape with an inner surface, and outer surface opposite the inner surface;
    wherein the reflective surface is located inside the transparent member and reflects the laser beam from inside of the transparent member out through the transparent member; and
    wherein the connection section connects the cone member to the transparent member and wherein the connection section wraps around an end of the transparent member and includes a flange which is disposed around a portion of the outer surface of the transparent member.

13. The laser generating device of claim 12, wherein the transparent member comprises glass.

14. The laser generating device of claim 13, wherein the cone member comprises metal.

15. The laser generating device of claim 14, wherein at least the flange of the cone member undergoes thermal expansion and contraction at a rate at least 50% greater than the rate of thermal expansion and contraction of the portion of the outer surface of the transparent member around which the flange is disposed.

16. The laser generating device of claim 12, wherein at least the flange of the cone member undergoes thermal expansion and contraction at a rate at least 100% greater than the rate of thermal expansion and contraction of the portion of the outer surface of the transparent member around which the flange is disposed.

17. A laser generating device, comprising:
    a housing;
    a laser module assembly, the laser module assembly at least partially housed in the housing, the laser module assembly including a pendulum assembly configured to rotate under the effects of gravity and a laser module on the pendulum assembly;
    wherein the laser module includes a laser generator, a transparent member and a cone member, the laser generator generating a laser beam which is directed towards the cone member;

wherein the cone member is one integral piece and comprises a connection section and a cone section, the cone section having a reflective surface, wherein the reflective surface reflects the laser beam into a laser line which exits the housing and is configured to project on an external surface outside of the laser generating device;

wherein the transparent member has a generally cylindrical shape with an inner surface, and outer surface opposite the inner surface;

wherein the reflective surface is located inside the transparent member and reflects the laser beam from the inside of the transparent member out through the transparent member; and wherein the connection section connects the cone member to the transparent member and wherein the connection section wraps around an end of the transparent member and includes a flange which is disposed outside the transparent member adjacent the outer surface; and wherein there is an adhesive between the flange and the outer surface of the transparent member which adheres the cone member to the transparent member.

18. The laser generating device of claim 17, wherein a coefficient of thermal expansion of the cone member is at least twice as much as a coefficient of thermal expansion of the transparent member.

19. The laser generating device of claim 17, wherein a coefficient of thermal expansion of the cone section is at least twice as much as a coefficient of thermal expansion of the transparent member.

20. The laser generating device of claim 17, wherein a coefficient of thermal expansion of the connection section is at least twice as much as a coefficient of thermal expansion of the transparent member.

* * * * *